(12) United States Patent
Tajima et al.

(10) Patent No.: US 10,298,200 B2
(45) Date of Patent: May 21, 2019

(54) SURFACE ACOUSTIC WAVE DEVICE, DUPLEXER AND COMB-SHAPED ELECTRODE

(71) Applicant: WISOL JAPAN CO., LTD., Kawasaki-shi, Kanagawa (JP)

(72) Inventors: Motoyuki Tajima, Kawasaki (JP); Takahiro Sato, Kawasaki (JP)

(73) Assignee: WISOL JAPAN CO., LTD., Kawasaki-Shi, Kanagawa (JP)

( * ) Notice: Subject to any disclaimer, the term of this patent is extended or adjusted under 35 U.S.C. 154(b) by 190 days.

(21) Appl. No.: 15/397,953

(22) Filed: Jan. 4, 2017

(65) Prior Publication Data

US 2017/0194936 A1 Jul. 6, 2017

(30) Foreign Application Priority Data

Jan. 5, 2016 (KR) ........................ 10-2016-0001207

(51) Int. Cl.
*H03H 9/25* (2006.01)
*H03H 9/64* (2006.01)
*H03H 9/72* (2006.01)
*H03H 9/145* (2006.01)

(52) U.S. Cl.
CPC .......... *H03H 9/14582* (2013.01); *H03H 9/25* (2013.01); *H03H 9/64* (2013.01); *H03H 9/6483* (2013.01); *H03H 9/6493* (2013.01); *H03H 9/725* (2013.01)

(58) Field of Classification Search
CPC ........... H03H 9/14502; H03H 9/14514; H03H 9/14582; H03H 9/25; H03H 9/64; H03H 9/6406; H03H 9/6423; H03H 9/6483; H03H 9/6493; H03H 9/725

USPC .......................................... 333/133, 193–196
See application file for complete search history.

(56) References Cited

U.S. PATENT DOCUMENTS

| 5,508,667 | A | * | 4/1996 | Kondratiev | ............ | H03H 9/009 310/313 C |
| 6,025,762 | A | * | 2/2000 | Roy | ......................... | H03H 3/08 330/174 |
| 6,201,457 | B1 | * | 3/2001 | Hickernell | ........... | H03H 9/6409 333/193 |

(Continued)

FOREIGN PATENT DOCUMENTS

JP 08-298432 A * 11/1996
JP 2007-013414 A * 1/2007

(Continued)

OTHER PUBLICATIONS

English language machine translation of JP 08-298432 A, published Nov. 12, 1996, 7 pages.*

(Continued)

*Primary Examiner* — Barbara Summons
(74) *Attorney, Agent, or Firm* — LRK Patent Law Firm

(57) ABSTRACT

A surface acoustic wave device of a ladder type includes a series resonator and a parallel resonator, in which the parallel resonator includes a first reflector, a second reflector, and a comb-shaped electrode located between the first reflector and the second reflector, and the comb-shaped electrode includes a first section in which electrode fingers are formed at a constant cycle, and a second section in which electrode fingers are formed at a constant cycle different from the cycle of the first section.

14 Claims, 15 Drawing Sheets

(56) References Cited

U.S. PATENT DOCUMENTS

| | | | | |
|---|---|---|---|---|
| 2004/0251989 A1* | 12/2004 | Takagi | ............... | H03H 9/02551 |
| | | | | 333/195 |
| 2012/0105165 A1* | 5/2012 | Yamanaka | ......... | H03H 9/02551 |
| | | | | 331/158 |
| 2013/0127554 A1* | 5/2013 | Yamanaka | ......... | H03H 9/02551 |
| | | | | 331/155 |
| 2016/0380176 A1* | 12/2016 | Kishino | ............. | H03H 9/14517 |
| | | | | 370/282 |

FOREIGN PATENT DOCUMENTS

| | | |
|---|---|---|
| JP | 2014-039199 A | 2/2014 |
| WO | WO 2015/080278 A1 * | 6/2015 |

OTHER PUBLICATIONS

English language machine translation of JP 2007-013414 A, published Jan. 18, 2007, 6 pages.*

* cited by examiner

FIG. 6
(a)
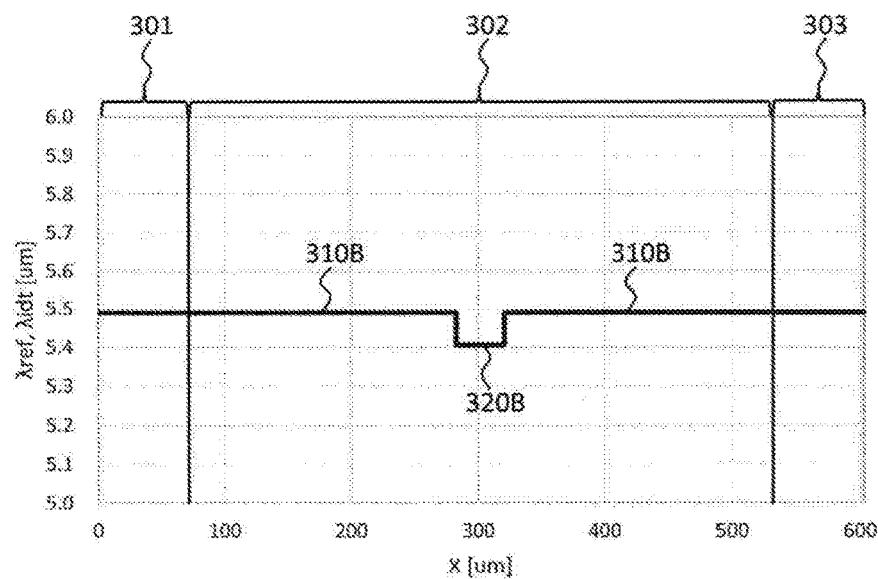
(b)
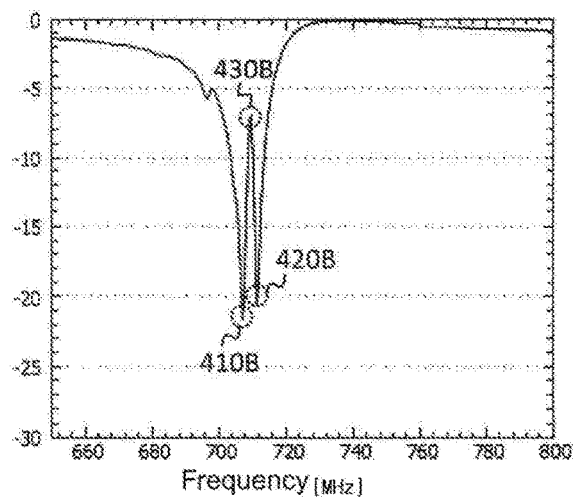

FIG. 12
(a) 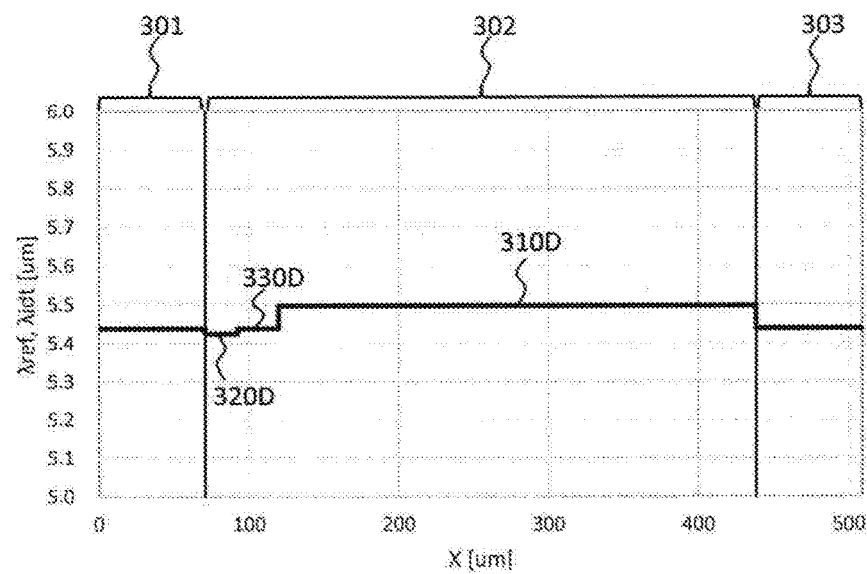
(b) 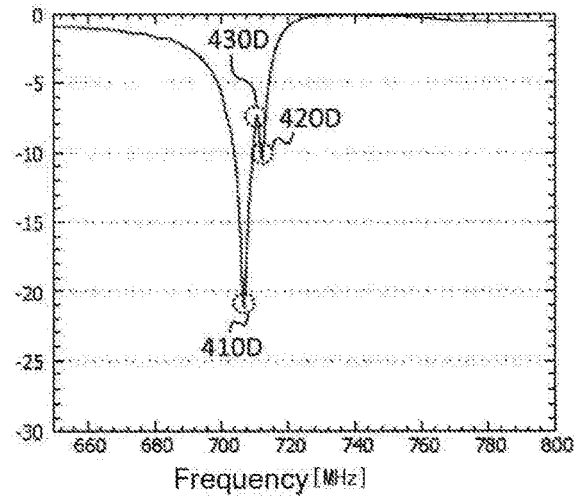

SURFACE ACOUSTIC WAVE DEVICE, DUPLEXER AND COMB-SHAPED ELECTRODE

CROSS REFERENCE TO RELATED APPLICATION

The present application claims priority to Korean Patent Application No. 10-2016-0001207, filed in the Korean Intellectual Property Office on Jan. 5, 2016, the entire content of which is incorporated herein by reference.

BACKGROUND OF THE INVENTION

1. Field of the Invention

The present invention relates to a surface acoustic wave device, a duplexer and a comb-shaped electrode.

2. Description of Related Art

A duplexer configured of a Surface Acoustic Wave (SAW) device is mounted on a communication device such as a portable terminal or the like to electrically separate a transmission path and a reception path.

Generally, a transmission side of a duplexer is configured of a surface acoustic wave device of a ladder type. In some cases, the surface acoustic wave device of a ladder type is requested to have a rapid (steep) attenuation characteristic in a low frequency band of the transmission band. Further, since such a surface acoustic wave device of a ladder type may have an attenuation deviated from a certain specification due to the non-uniformity of the characteristic when the surface acoustic wave device is manufactured, a process margin needs to be increased for the low frequency band of the transmission band to enhance manufacturing throughput.

SUMMARY OF THE INVENTION

Patent document 1 discloses a SAW filter of a ladder type, a duplexer and a module, which can combine low loss and high suppression. However, patent document 1 has a problem in that it does, not consider a process margin such as a resonance point or the like. Accordingly, the SAW filter disclosed in the patent document 1 may lower throughput in manufacturing the SAW filter.

An object of the present invention is to provide a surface acoustic wave device, a duplexer and a comb-shaped electrode, which combine a rapid (steep) attenuation characteristic with high manufacturing throughput.

To accomplish the above object, according to one aspect of the present invention, there is provided a surface acoustic wave device of a ladder type comprising a series resonator and a parallel resonator, in which the parallel resonator includes a first reflector, a second reflector, and a comb-shaped electrode located between the first reflector and the second reflector, and the comb-shaped electrode includes at least a first section in which electrode fingers are formed at a constant cycle, and a second section in which electrode fingers are formed at a constant cycle different from the cycle of the first section.

A duplexer of another aspect of the present invention is provided with the surface acoustic wave device of one aspect of the present invention.

A comb-shaped electrode of another aspect of the present invention is a comb-shaped electrode used in a surface acoustic wave device of a ladder type, and the comb-shaped electrode includes at least a first section in which electrode fingers are formed at a constant cycle, and a second section in which electrode fingers are formed at a constant cycle different from the cycle of the first section.

BRIEF DESCRIPTION OF THE DRAWINGS

FIG. 6 shows (a) a graph showing the cycles of the electrode fingers and the electrodes of the SAW resonator of the second embodiment, and (b) a graph showing, the frequency characteristic of the SAW resonator of the second embodiment.

FIG. 12 shows (a) a graph showing the cycles of the electrode fingers and the electrodes of the SAW resonator of the fourth embodiment, and (b) a graph showing the frequency characteristic of the SAW resonator of the fourth embodiment.

DETAILED DESCRIPTION OF THE PREFERRED EMBODIMENT

Figure 1:
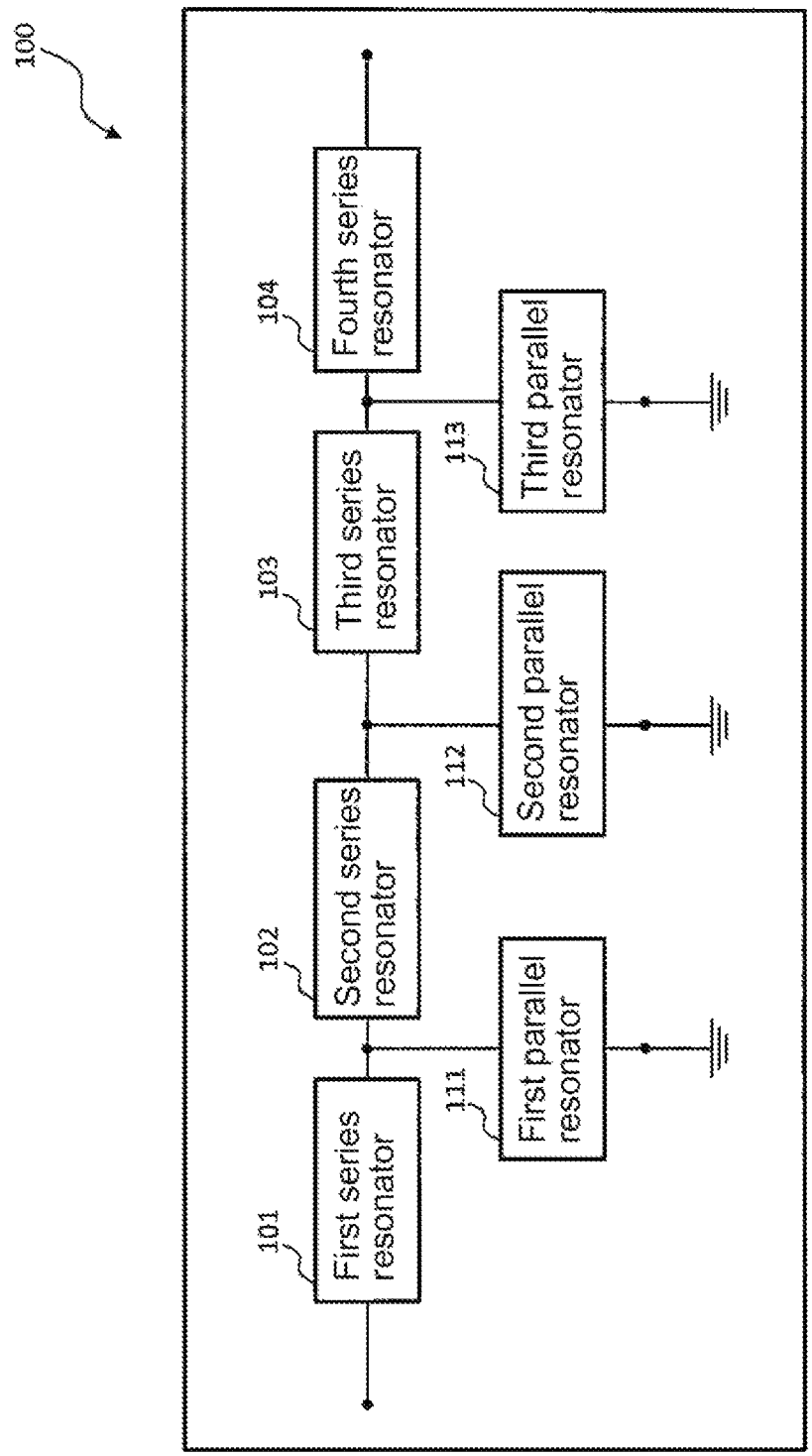
FIG. 1 is a block diagram showing the configuration of a surface acoustic wave device related to the present invention.

The preferred embodiments of the invention will be hereafter described in detail, with reference to the accompanying drawings. In addition, to avoid the trouble of repeated description, like or similar reference numerals refer to like elements in each of the drawings, and a duplicated description thereof will be omitted appropriately.

[Surface Acoustic Wave Device]

First, although a general surface acoustic wave device is described with reference to FIG. 1, configuration of the circuit is the same in the present invention. FIG. 1 is a block diagram showing an example of the configuration of a surface acoustic wave device 100.

As shown in FIG. 1, the surface acoustic wave device 100 is provided with a first series resonator 101, a second series resonator 102, a third series resonator 103, a fourth series resonator 104, a first parallel resonator 111, a second parallel resonator 112 and a third parallel resonator 113.

The first series resonator 101, the second series resonator 102, the third series resonator 103 and the fourth series resonator 104 are configured, for example, by a 1-port SAW resonator and connected in series.

The first parallel resonator 111, the second parallel resonator 112 and the third parallel resonator 113 are configured, for example, by a 1-port SAW resonator.

The first parallel resonator 111 is connected between the first series resonator 101 and the second series resonator 102. Specifically, the first parallel resonator 111 is connected in parallel with respect to the first series resonator 101, the second series resonator 102, the third series resonator 103 and the fourth series resonator 104 and is also connected to the ground.

The second parallel resonator 112 is connected between the second series resonator 102 and the third series resonator 103. Specifically, the second parallel resonator 112 is connected in parallel with respect to the first series resonator 101, the second series resonator 102, the third series resonator 103 and the fourth series resonator 104 and is also connected to the ground.

The third parallel resonator 113 is connected between the third series resonator 103 and the fourth series resonator 104. Specifically, the third parallel resonator 113 is connected in parallel with respect to the first series resonator 101, the second series resonator 102, the third series resonator 103 and the fourth series resonator 104 and is also connected to the ground.

That is, the surface acoustic wave device 100 is a surface acoustic wave device of a ladder type configured of four series resonators and three parallel resonators. In addition, although the surface acoustic wave device 100 provided with four series resonators and three parallel resonators is described hereinafter, this is an example and does not limit the present invention. The surface acoustic wave device 100 may be provided with an arbitrary number of series resonators and parallel resonators according to design.

[Saw Resonator]

Before describing a SAW resonator related to the present invention, the configuration of a general SAW resonator will be described.

Figure 14:
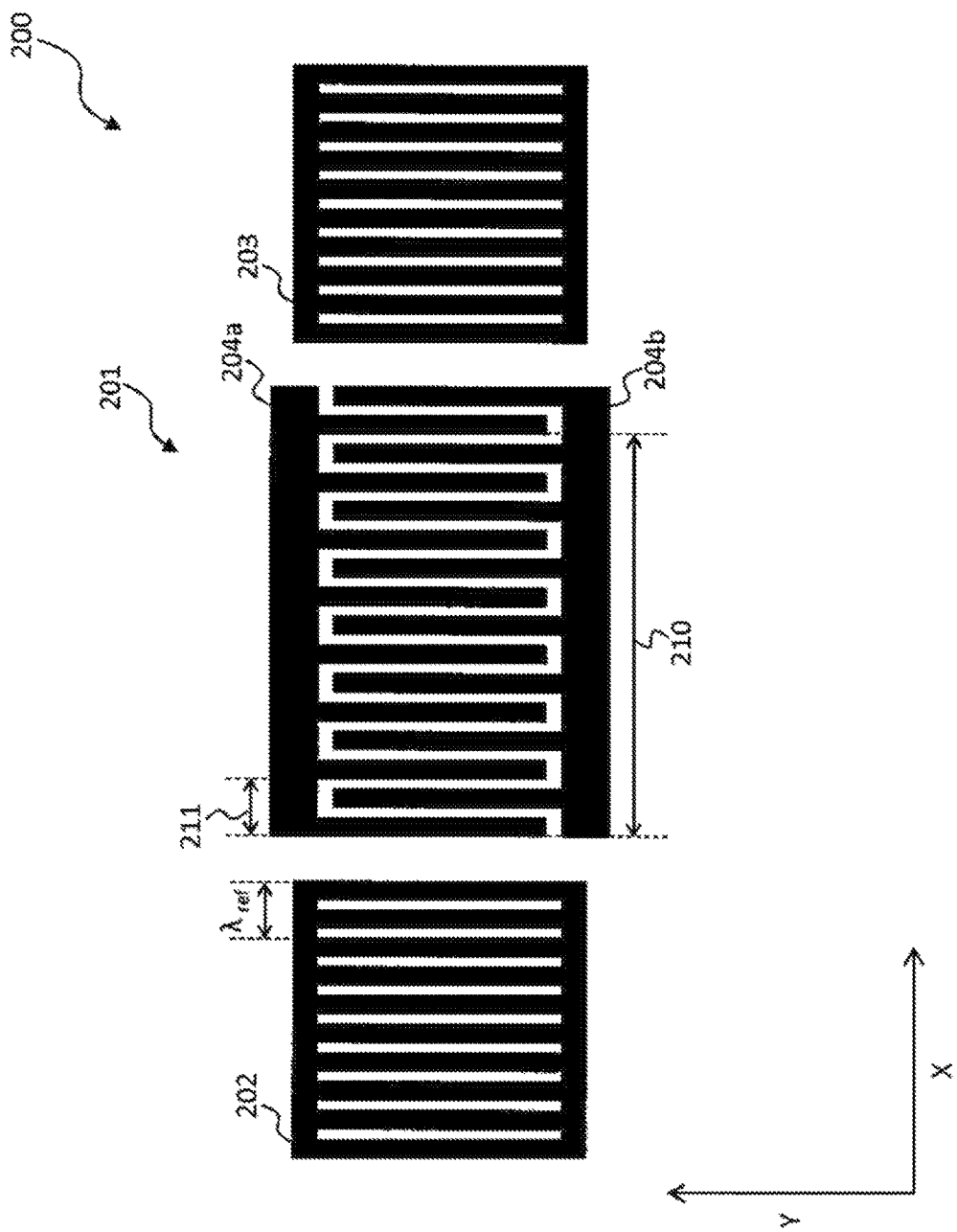
FIG. 14 is a top view showing a general SAW resonator.

FIG. 14 is a top view showing a general SAW resonator.

A SAW resonator 200 is provided with a comb-shaped electrode 201, a first reflector 202 and a second reflector 203.

As shown in FIG. 14, the comb-shaped electrode 201 has a structure of alternatingly combining a first electrode 204a and a second electrode 204b formed in the shape of a comb.

Describing specifically, the first electrode 204a and the second electrode 204b respectively have a predetermined length (in the Y direction in FIG. 14) and a predetermined width (in the X direction in FIG. 14), and the electrodes 204a and 204b configure a plurality of electrode fingers. In the first electrode 204a and the second electrode 204b, the plurality of electrode fingers is formed at predetermined intervals. As shown in FIG. 14, the comb-shaped electrode 201 has a structure of alternatingly combining, a plurality of electrode fingers of the first electrode 204a and the second electrode 204b from the Y direction.

The comb-shaped electrode 201 has a first section in which the electrode fingers configured of the electrodes 204a and 204b are formed at a constant first cycle 211.

The first reflector 202 and the second reflector 203 are reflectors, for example, configured by arranging a plurality of electrodes at a predetermined cycle $\lambda_{ref}$. Generally, the cycles $\lambda_{ref}$ of the electrodes of the first reflector 202 and the second reflector 203 and, the cycle $\lambda_{IDT}$ of the electrodes of the comb-shaped electrode 201 are designed to be the same. The SAW resonator 200 can be configured by arranging the comb-shaped electrode 201 between the first reflector 202 and the second reflector 203 on a piezoelectric substrate.

[Structure and Frequency Characteristic of General SAW Resonator]

Next, the cycle of the electrode fingers of the comb-shaped electrode 201 of the SAW resonator 200 and the frequency characteristic of the surface acoustic wave device 100 provided with the SAW resonator 200 will be described.

Figure 15:
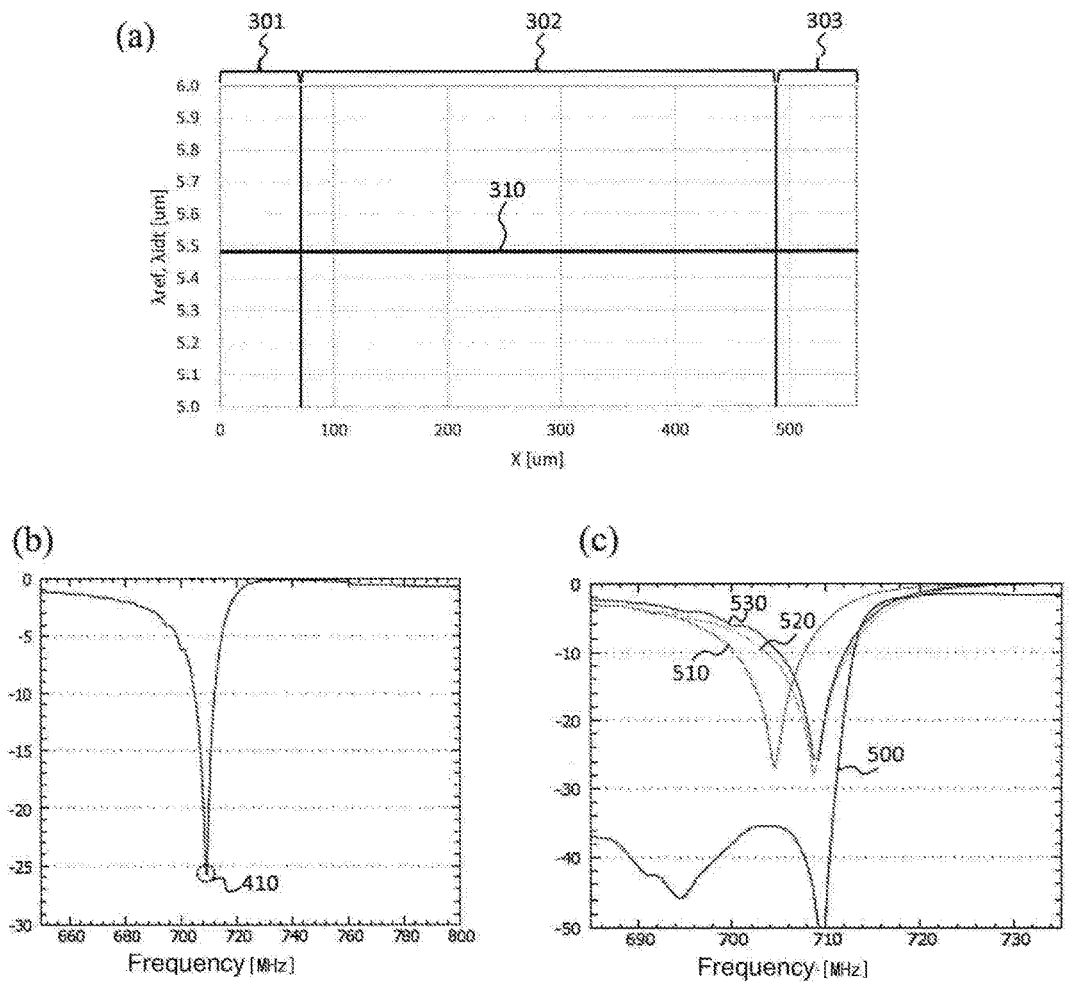
FIG. 15 shows (a) a graph showing the cycles of the electrode fingers and the electrodes of a general SAW resonator, (b) a graph showing the frequency characteristic of the general SAW resonator, and (c) a graph showing the frequency characteristic of a parallel resonator provided in the general surface acoustic wave device.

In FIG. 15, (a) is a graph showing the cycles of the electrode fingers and the electrodes of the comb-shaped electrode 201, the first reflector 202 and the second, reflector 203 of the SAW resonator 200 shown in FIG. 14. In (a) of FIG. 15, the horizontal axis represents a position μm, and the vertical axis represents cycles μm of the electrode fingers and the electrodes.

A first section 301 shows the cycle of the electrodes of the first reflector 202 shown in FIG. 14. A second section 302 shows the cycle of the electrode fingers of the comb-shaped electrode 201. A third section 303 shows the cycle of the electrodes of the second reflector 203.

That is, in the SAW resonator 200 shown in the figure, the cycles of the electrode fingers and the electrodes of the comb-shaped electrode 201, the first reflector 202 and the second reflector 203 are constant, for example, 5.5 μm.

In FIG. 15, (b) is a graph showing the frequency characteristic when the SAW resonator 200 is connected as a parallel resonator, in which the horizontal axis represents a frequency MHz, and the vertical axis represents insertion loss dB. Specifically, in (b) of FIG. 15, the horizontal axis represents a frequency of about 650 to 800 MHz, and the vertical axis represents insertion loss of −30 to 0 dB.

The SAW resonator 200 has a first resonance point 410 in the frequency band of about 708 MHz. That is, the SAW resonator 200 may suppress a signal in the frequency band of about 708 MHz as much as about −26 dB. Accordingly, the SAW resonator 200 has one resonance point in the band of about 650 to 800 MHz.

In FIG. 15, (c) is a graph showing the frequency characteristic of a low frequency band of the surface acoustic wave device 100 provided with the SAW resonator 200 as a parallel resonator.

Specifically, a first frequency characteristic 500 shows the frequency characteristic of the surface acoustic wave device 100 shown in FIG. 1. A first parallel resonator frequency characteristic 510 shows the frequency characteristic of the first parallel resonator 111 shown in FIG. 1. A second parallel resonator frequency characteristic 520 shows the frequency characteristic of the second parallel resonator 112 shown in FIG. 1. A third parallel resonator frequency characteristic 530 shows the frequency characteristic of the third parallel resonator 113 shown in FIG. 1.

As shown in (c) of FIG. 15, the first parallel resonator frequency characteristic 510 of the first parallel resonator 111 has a resonance point of −28 dB in the frequency band of about 704 MHz. The second parallel resonator frequency characteristic 520 of the second parallel resonator 112 has a resonance point of −28 dB in the frequency band of about 708 MHz. The third parallel resonator frequency characteristic 530 of the third parallel resonator 113 has a resonance point of −26 dB in the frequency band of about 708 MHz.

That is, the first parallel resonator 111, the second parallel resonator 112 and the third parallel resonator 113 respectively have one resonance point. In addition, the surface acoustic wave device 100 has an attenuation characteristic according to the resonance points of the first parallel resonator 111, the second parallel resonator 112 and the third parallel resonator 113.

Although it is described below, in the present invention, a surface acoustic wave device of a ladder type having an attenuation characteristic further rapider (steeper) than the frequency characteristic shown in (c) of FIG. 15 and, in addition, having high manufacturing throughput can be obtained by changing the design of the SAW resonator connected as a parallel resonator.

First Embodiment

Figure 2:
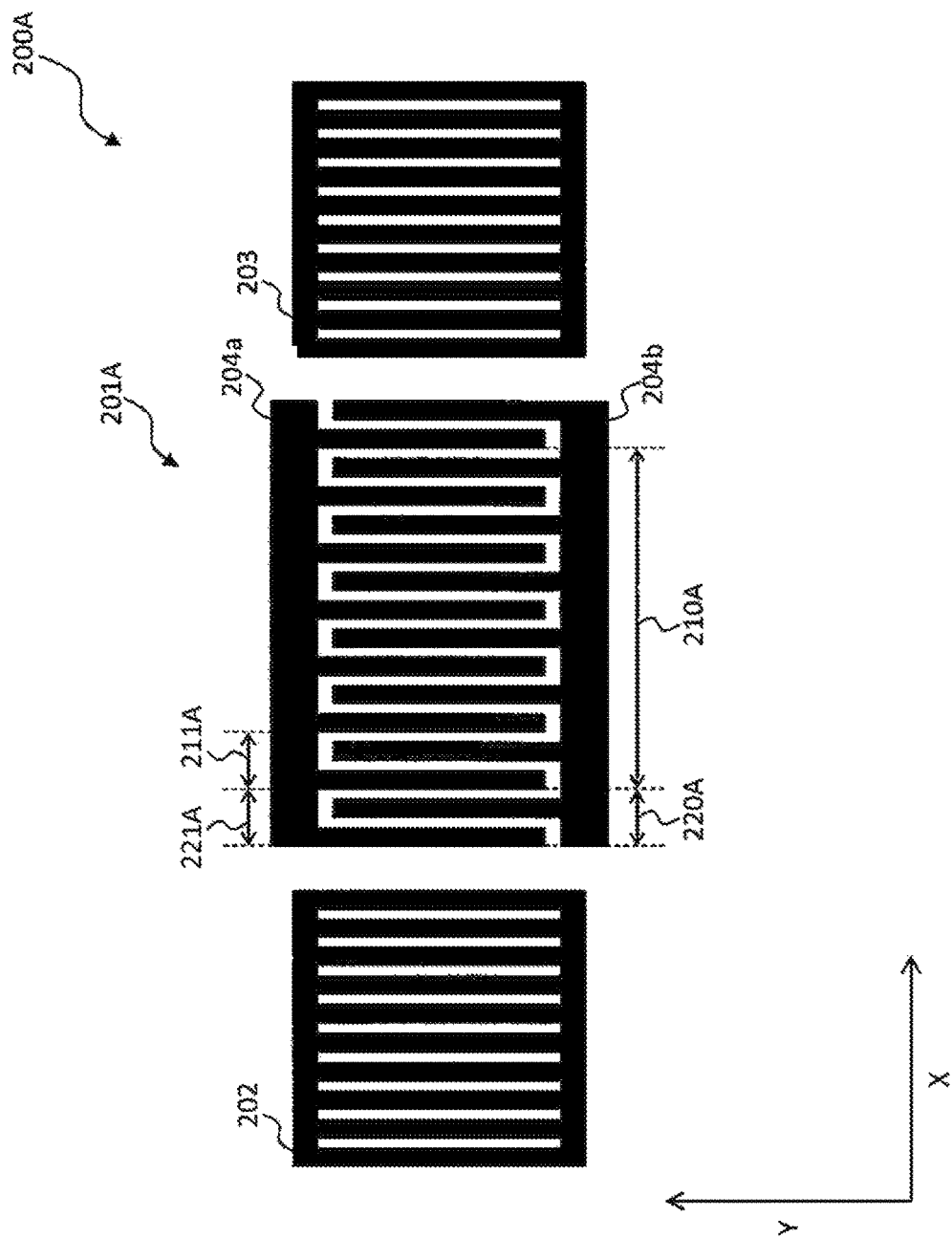
FIG. 2 is a top view showing a SAW resonator related to a first embodiment of the present invention.

FIG. 2 is a top view showing a SAW resonator 200A related to a first embodiment of the present invention.

The SAW resonator 200A is provided with a comb-shaped electrode 201A, a first reflector 202 and a second reflector 203.

As shown in FIG. 2, the SAW resonator 200A has a first section 210A and a second section 220A.

The first section 210A is a section in which electrode fingers configured of two electrodes arranged up and down are formed at a constant first cycle 211A.

The second section 220A is a section formed in the comb-shaped electrode 201A, in which electrode fingers are formed at a second cycle 221A, which is a constant cycle different from the first cycle 211A. In the comb-shaped electrode 201A, the second section 220A is formed at an adjacent location nearest from the first reflector 202.

That is, the comb-shaped electrode 201A has two sections having different cycles of electrode fingers.

Figure 3:
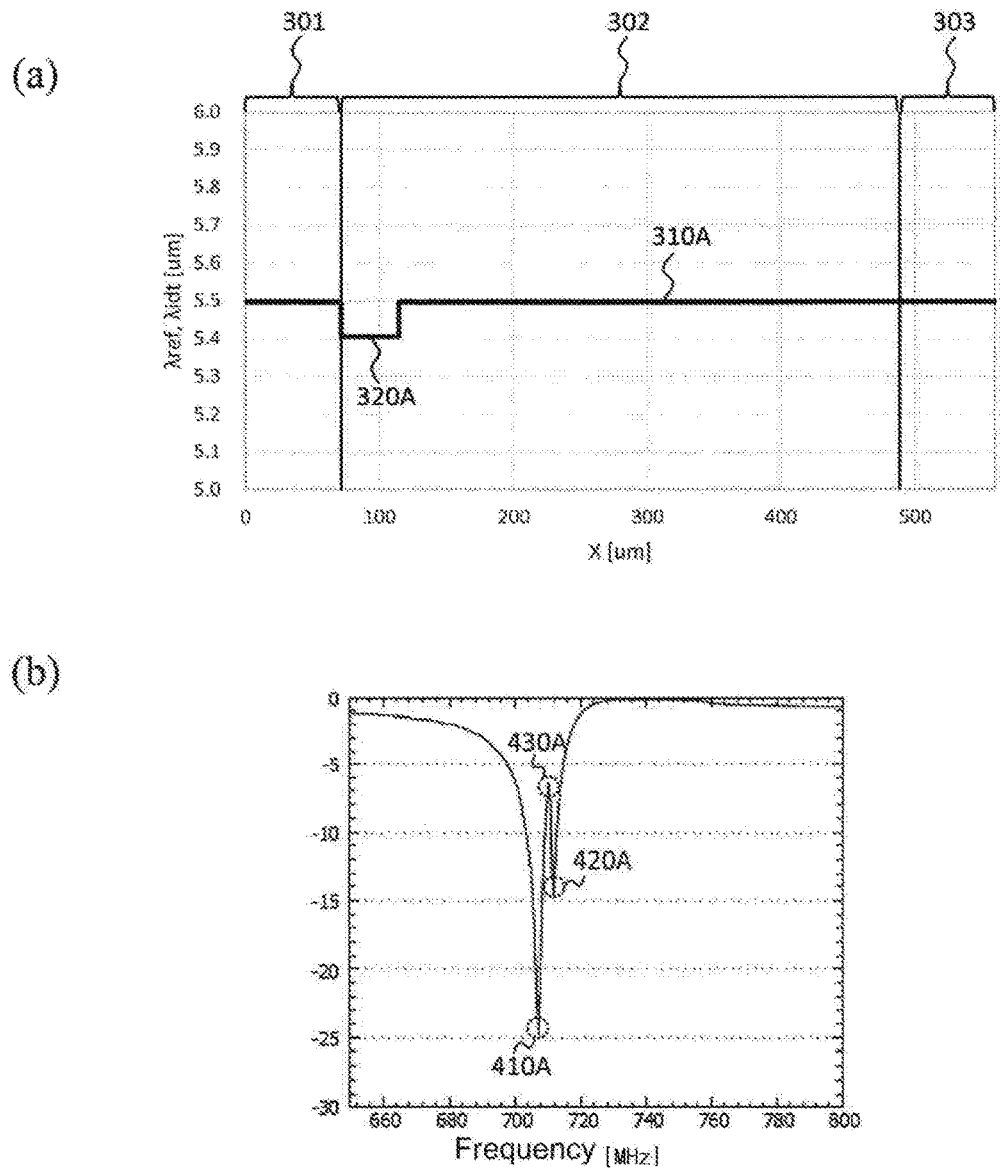
FIG. 3 shows (a) a graph showing the cycles of the electrode fingers and the electrodes of the SAW resonator of the first embodiment, and (b) a graph showing the frequency characteristic of the SAW resonator of the first embodiment.

In FIG. 3, (a) is a graph showing the cycles of the electrode fingers and the electrodes of the comb-shaped electrode 201A, the first reflector 202 and the second reflector 203, in which the horizontal axis represents a position μm, and the vertical axis represents a cycle μm.

A first range 310A shows the first cycle 211A shown in FIG. 2. A second range 320A shows the second cycle 221A shown in FIG. 2.

As shown in (a) of FIG. 3, the first cycle 211A is 5.497 μm. The second cycle 221A is 5.406 μm. In addition, the cycles shown in (a) of FIG. 3 are examples and do not limit the present invention.

A ratio of the second cycle 221A to the first cycle 211A is about 98.3%. Specifically, the ratio of the second cycle 221A to the first cycle 211A is preferably 95% or higher and lower than 100%.

A ratio of the number of pairs of the electrode fingers of the second section 220A to the number of pairs of the electrode fingers of the entire comb-shaped electrode 201A is about 10%. Specifically, the ratio of the number of pairs of the electrode fingers of the second section 220A to the number of pairs of the electrode fingers of the entire comb-shaped electrode 201A is preferably lower than 20%.

In FIG. 3, (b) is a graph showing the frequency characteristic when the SAW resonator 200A is connected as a parallel resonator, in which the horizontal axis represents a frequency MHz, and the vertical axis represents insertion loss dB. Specifically, (b) of FIG. 3 shows the frequency characteristic of the SAW resonator 200A, in which the horizontal axis is in a range of about 650 to 800 MHz, and the vertical axis is in a range of −30 to 0 dB.

As shown in (b) of FIG. 3, the SAW resonator 200A has a first resonance point 410A in the frequency band of about 706 MHz. That is, the first resonance point 410A corresponds to the first resonance point 410 of the general SAW resonator 200. In addition, the insertion loss of the first resonance point 410A is about −25 dB.

In addition, the SAW resonator 200A has a second resonance point 420A in the frequency band of about 712 MHz. The insertion loss of the second resonance point 420A is about −15 dB. That is, the SAW resonator 200A may also suppress a signal of the frequency band of about 712 MHz.

Accordingly, the SAW resonator 200A also has a resonance point on the side of a frequency band higher than that of the SAW resonator 200. Since the SAW resonator 200A also has a resonance point, on the side of a frequency band higher than that of the SAW resonator 200 like this, it may attenuate a signal on the side of a low frequency band of a pass band more rapidly (steeply) than the SAW resonator 200 does. That is, as a result of forming the second resonance point 420A, the attenuation characteristic is further rapider (steeper) between 720 MHz and 715 MHz.

In addition, the SAW resonator 200A has an anti-resonance point 430A in the frequency band between the first resonance point 410A and the second resonance point 420A. The insertion loss of the anti-resonance point 430A is about −6 dB. That is, since the SAW resonator 200A may not rapidly (steeply) attenuate a signal in the frequency band of the anti-resonance point 430A, there may be a case in which the anti-resonance point 430A needs to be suppressed when the SAW resonator 200A is mounted on the surface acoustic wave device.

Figure 4:
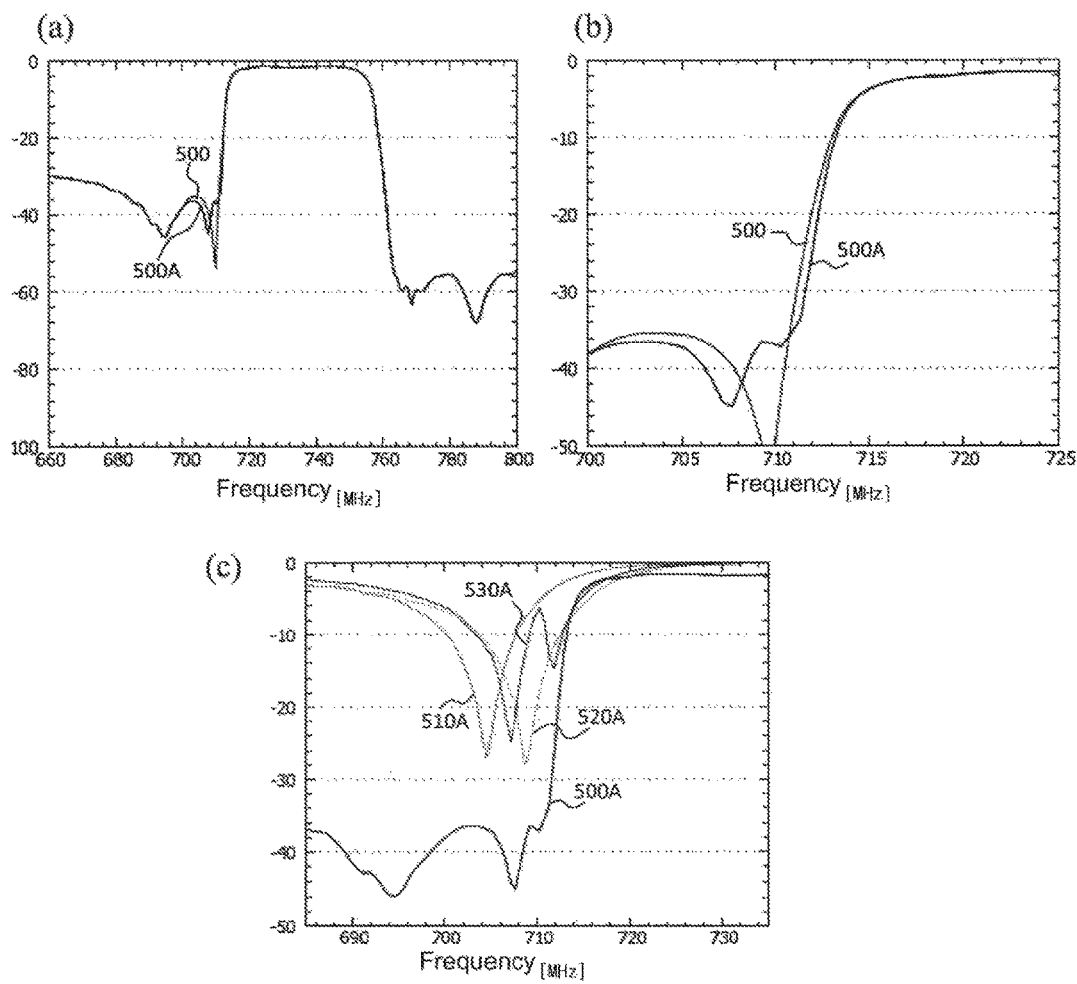
FIG. 4 shows (a) a graph showing the frequency characteristic of the surface acoustic wave device of the first embodiment and the frequency characteristic of a general surface acoustic wave device, (b) a graph partially enlarging (a) of FIG. 4, and (c) a graph showing the frequency characteristic of a parallel resonator provided in the surface acoustic wave device of the first embodiment.

FIG. 4 is a graph for comparing the frequency characteristic of the surface acoustic wave device 100 and the frequency characteristic of the surface acoustic wave device 100A provided with a SAW resonator 200A related to the present invention. Since the surface acoustic wave device related to the present invention has a configuration the same as shown in FIG. 1, the surface acoustic wave device related to the present invention is described herein by assigning a reference numeral of 100A. In addition, hereinafter, the surface acoustic wave device 100A will be described assuming that only the third parallel resonator 113 is the SAW resonator 200A in the block diagram shown in FIG. 1.

In FIG. 4, (a) is a graph showing the frequency characteristics of the surface acoustic wave device 100 and the surface acoustic wave device 100A, in which the horizontal axis represents a frequency MHz, and the vertical axis represents insertion loss dB. Specifically, (a) of FIG. 4 shows the frequency characteristics of the surface acoustic wave device 100 and the surface acoustic wave device 100A, in which the horizontal axis is in a range of about 660 to 800 MHz, and the vertical axis is in a range of −100 to 0 dB.

In (a) of FIG. 4, the first frequency characteristic 500 shows the frequency characteristic of the surface acoustic wave device 100, and the first frequency characteristic 500A shows the frequency characteristic of the transmission band of the surface acoustic wave device 100A.

There is a case in which the surface acoustic wave device mounted on the transmission side of the duplexer is required to attenuate a signal on the low frequency side of a pass band as much as at least 201:113. In (a) of FIG. 4, the surface acoustic wave device 100 and the surface acoustic wave device 100A have a rapid (steep) attenuation characteristic on the low frequency side of a pass band.

In FIG. 4, (b) is a graph showing enlarged attenuation bands of the low frequency band side of the first frequency characteristic 500 and the first frequency characteristic 500A. Specifically, in (b) of FIG. 4, the range of the horizontal axis is 700 to 725 MHz, and the range of the vertical axis is −50 to 0 dB.

As shown in (b) of FIG. 4, in the attenuation band of about −36 to −10 dB, the surface acoustic wave device 100A attenuates a signal more rapidly (steeply) than the surface acoustic wave device 100 does. As a result, the first frequency characteristic 500A shows a characteristic of being shifted toward the high frequency band side compared with the first frequency characteristic 500. Accordingly, in the attenuation band of about −36 to −10 dB, the surface acoustic wave device 100A has a process margin as wide as a difference between the first frequency characteristic 500A and the first frequency characteristic 500. Therefore, in the surface acoustic wave device 100A, the cases in which the characteristic deviates from the specification are reduced owing to the non-uniformity of the characteristic when the surface acoustic wave device is manufactured. That is, the surface acoustic wave device 100A improves the process margin and the manufacturing throughput compared with the surface acoustic wave device 100.

In FIG. 4, (c) is a graph showing the frequency characteristics of the low frequency band side of the transmission band of the surface acoustic wave device 100A, the first parallel resonator 111, the second parallel resonator 112 and the third parallel resonator 113 having a configuration the same as shown in FIG. 1. Specifically, in (c) of FIG. 4, the horizontal axis represents a range of 685 to 735 MHz, and the vertical axis represents a range of −50 to 0 dB.

In (c) of FIG. 4, the first frequency characteristic 500A is the frequency characteristic of the surface acoustic wave device 100A. The first parallel resonator frequency characteristic 510A is the frequency characteristic of the first parallel resonator 111. The second parallel resonator frequency characteristic 520A is the frequency characteristic of the second parallel resonator 112. The third parallel resonator frequency characteristic 530A is the frequency characteristic of the third parallel resonator 113.

As shown in (c) of FIG. 4, the first parallel resonator 111 has a resonance point of −27 dB in the frequency band of about 704 MHz.

The second parallel resonator 112 has a resonance point of −28 dB in the frequency band of about 708 MHz.

The third parallel resonator 113 has a resonance point of −25 dB in the frequency band of about 706 MHz and a resonance point of −15 dB in the frequency band of about 712 MHz. In addition, the third parallel resonator 113 has an anti-resonance point of −6 dB in the frequency band of about 708 MHz.

That is, the resonance point of the second parallel resonator 112 corresponds to the anti-resonance point of the third parallel resonator 113. Therefore, the second parallel resonator 112 may suppress the anti-resonance point of the third parallel resonator 113. As a result, as shown in (b) of FIG. 4, the surface acoustic wave device 100A has an attenuation characteristic further rapider (steeper) than that of the surface acoustic wave device 100.

In addition, the second parallel resonator 112 may arbitrarily design a frequency band of a resonance point according to the anti-resonance point of the third parallel resonator 113. In addition, a resonator suppressing the anti-resonance point of the third parallel resonator 113 is not limited to the second parallel resonator 112. Since a resonance point of a resonator may be arbitrarily designed, the first parallel resonator 111 may be designed to suppress the anti-resonance point of the third parallel resonator 113.

Second Embodiment

Figure 5:
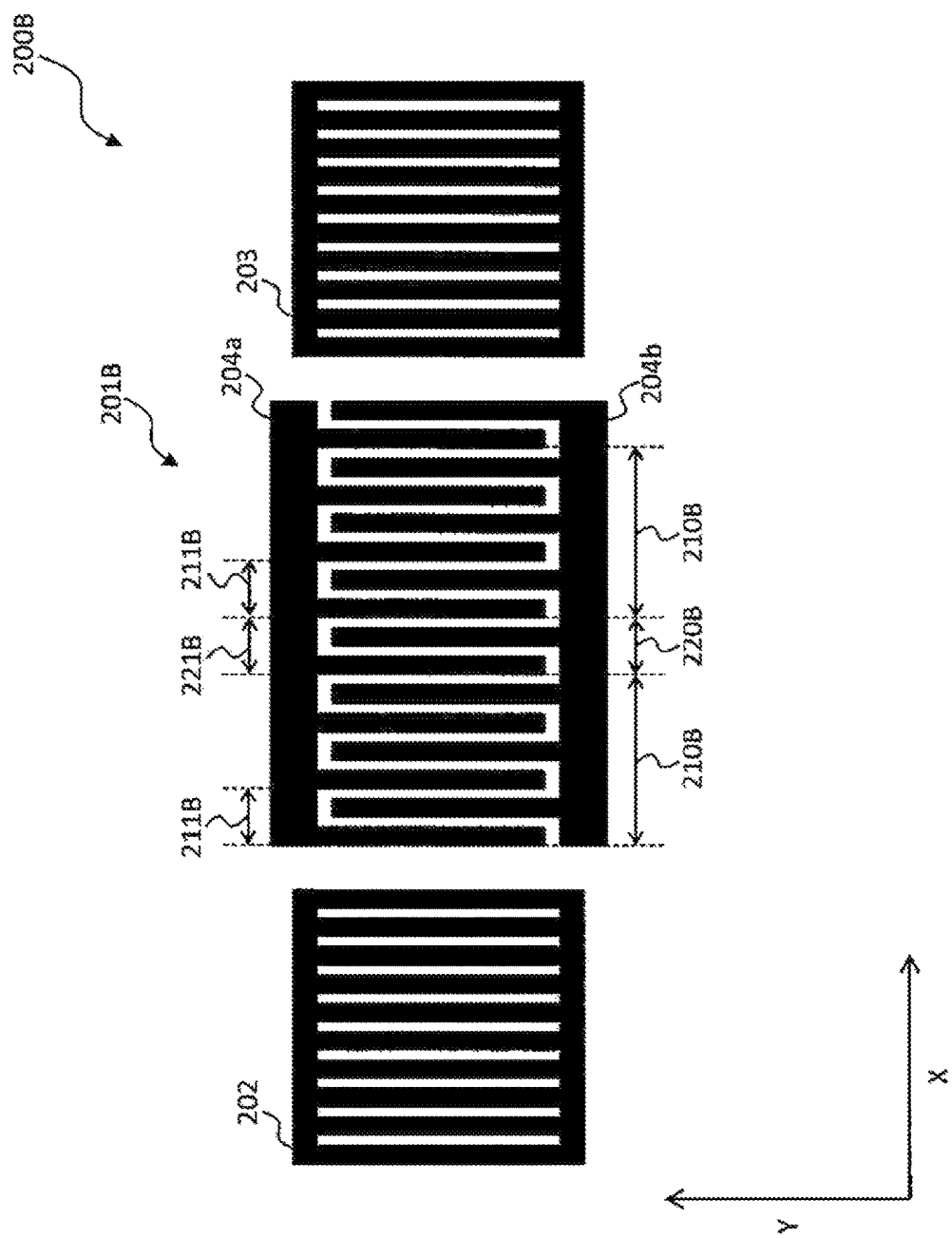
FIG. 5 is a top view showing a SAW resonator related to a second embodiment of the present invention.

FIG. 5 is a top view showing a SAW resonator 200B related to a second embodiment of the present invention.

The SAW resonator 200B is provided with a comb-shaped electrode 201B, a first reflector 202 and a second reflector 203.

As shown in FIG. 5, the SAW resonator 200B has a first section 210B and a second section 220B.

The first section 210B is a section in which electrode fingers are formed at a constant first cycle 211B.

The second section 220B is a section formed in the comb-shaped electrode 201B, in which electrode fingers are formed at a second cycle 221B, which is a constant cycle different from the first cycle 211B. Specifically, the second section 220B is formed at the center of the comb-shaped electrode 201B.

That is, the comb-shaped electrode 201B has two sections having different cycles of electrode fingers.

In FIG. 6, (a) is a graph showing the cycles of the electrode fingers and the electrodes of the comb-shaped electrode 201B, the first reflector 202 and the second reflector 203 of the SAW resonator 200B, in which the horizontal axis represents a position μm, and the vertical axis represents a cycle μm.

A first range 310B shows the first cycle 211B shown in FIG. 5. A second range 320B shows the second cycle 221B shown in FIG. 5.

As shown in (a) of FIG. 6, the first cycle 211B is 5.490 μm. The second cycle 221B is 5.406 μm. In addition, the cycles shown in (a) of FIG. 6 are examples and do not limit the present invention.

A ratio of the second cycle 221B to the first cycle 211B is about 98.5%. Specifically, the ratio of the second cycle 221B to the first cycle 211B is preferably 95% or higher and lower than 100%.

A ratio of the number of pairs of the electrode fingers of the second section 220B to the number of pairs of the electrode fingers of the entire comb-shaped electrode 201B is about 8.3%. Specifically, the ratio of the number of pairs of the electrode fingers of the second section 220B to the number of pairs of the electrode fingers of the entire comb-shaped electrode 201B is preferably lower than 20%.

In FIG. 6, (b) is a graph showing the frequency characteristic when the SAW resonator 200B is connected as a parallel resonator, in which the horizontal axis represents a frequency MHz, and the vertical axis represents insertion loss dB. Specifically, (b) of FIG. 6 shows the frequency characteristic of the SAW resonator 200B, in which the horizontal axis is in a range of about 650 to 800 MHz, and the vertical axis is in a range of −30 to 0 dB.

The SAW resonator 200B has a first resonance point 410B in the frequency band of about 706 MHz. That is, the first resonance point 410B corresponds to the first resonance point 410 of the general SAW resonator 200. In addition, the insertion loss of the first resonance point 410B is about −22 dB.

In addition, the SAW resonator 200B has a second resonance point 420B in the frequency band of about 712 MHz. The insertion loss of the second resonance point 420B is about −20 dB. That is, the SAW resonator 200B may also suppress a signal of the frequency band of about 712 MHz.

Accordingly, the SAW resonator 200B also has a resonance point, on the side of a frequency band higher than that of the SAW resonator 200. Since the SAW resonator 200B also has a resonance point on the side of a frequency band higher than that of the SAW resonator 200 like this, it may attenuate a signal on the side of a low frequency band of a pass band more rapidly (steeply) than the SAW resonator 200 does.

In addition, the SAW resonator 200B has an anti-resonance point 430B in the frequency band between the first resonance point 410B and the second resonance point 420B. The insertion loss of the anti-resonance point 430B is about −7 dB. That is, the anti-resonance point 430B needs to be suppressed when the SAW resonator 200B is mounted on the surface acoustic wave device.

Figure 7:
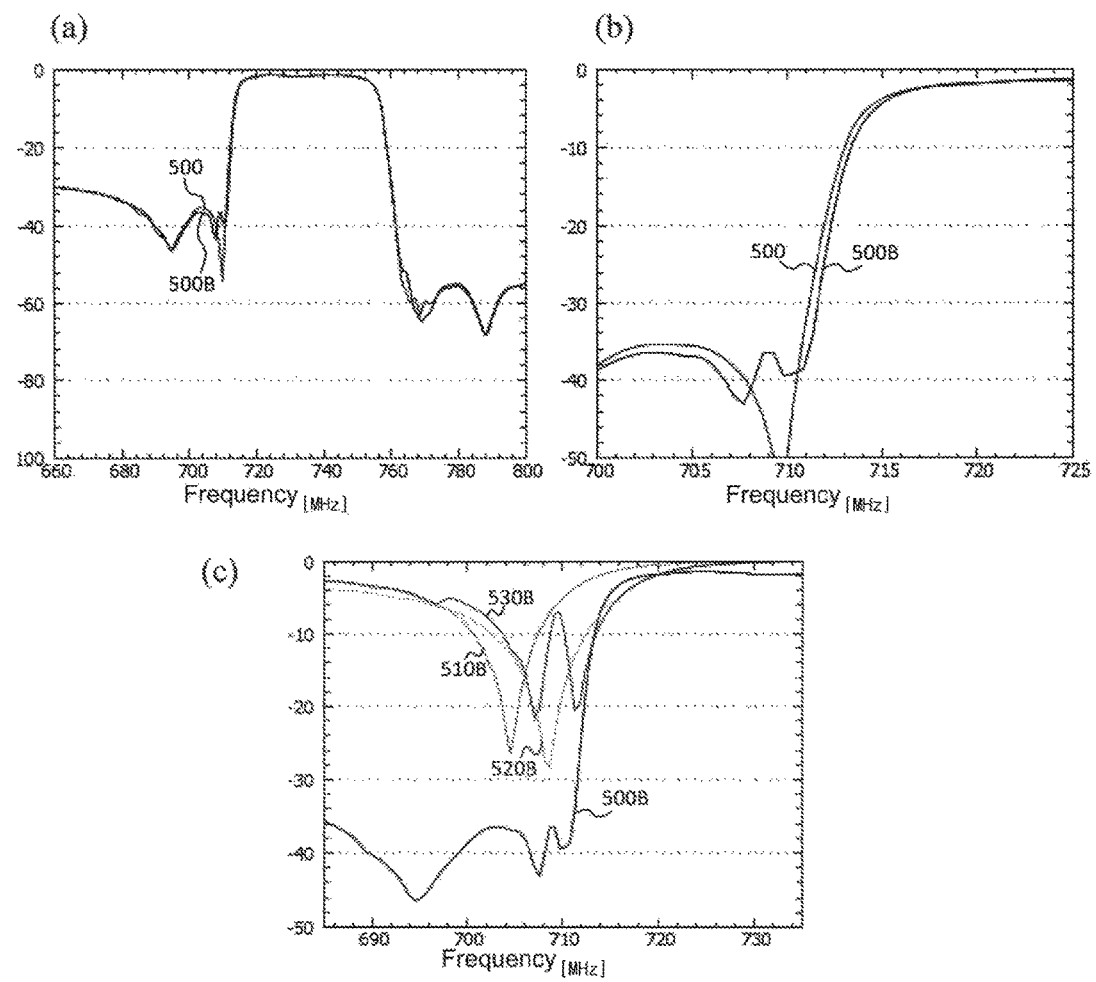
FIG. 7 shows (a) a graph showing the frequency characteristic of the surface acoustic wave device of the second embodiment and the frequency characteristic of a general surface acoustic wave device, (b) a graph partially enlarging (a) of FIG. 7, and (c) a graph showing the frequency characteristic of a parallel resonator provided in the surface acoustic wave device of the second embodiment.

FIG. 7 is a graph for comparing the frequency characteristic of the surface acoustic wave device 100 and the frequency characteristic of the surface acoustic wave device 100B provided with a SAW resonator 200B. In addition, hereinafter, the surface acoustic wave device 100B will be described assuming that only the third parallel resonator 113 is the SAW resonator 200B in the block diagram shown in FIG. 1.

In FIG. 7, (a) is a graph showing the frequency characteristics of the surface acoustic wave device 100 and the surface acoustic wave device 100B, in which the horizontal axis represents a frequency MHz, and the vertical axis represents insertion loss dB. Specifically, (a) of FIG. 7 shows the frequency characteristics of the surface acoustic wave device 100 and the surface acoustic wave device 100B, in which the horizontal axis is in a range of about 660 to 800 MHz, and the vertical axis is in a range of −100 to 0 dB.

In (a) of FIG. 7, the first frequency characteristic 500B shows the frequency characteristic of the surface acoustic wave device 100B. In (a) of FIG. 7, the surface acoustic wave device 100 and the surface acoustic wave device 100B have a rapid (steep) attenuation characteristic on the low frequency side of a pass band.

In FIG. 7, (b) is a graph showing enlarged attenuation bands of the low frequency band side of the first frequency characteristic 500 and the first frequency characteristic 500B. Specifically, in (b) of FIG. 7, the range of the horizontal axis is 700 to 725 MHz, and the range of the vertical axis is −50 to 0 dB.

As shown in (b) of FIG. 7, in the attenuation band of about −38 to −4 dB, the surface acoustic wave device 100B attenuates a signal more rapidly (steeply) than the surface acoustic wave device 100 does. As a result, the first frequency characteristic 500B shows a characteristic of being shifted toward the high frequency band side compared with the first frequency characteristic 500. Accordingly, in the attenuation band of about −38 to −4 dB, the surface acoustic wave device 100B has a process margin as wide as a difference between the first frequency characteristic 500B and the first frequency characteristic 500. That is, the surface acoustic wave device 100B improves the process margin and the manufacturing throughput compared with the surface acoustic wave device 100.

In FIG. 7, (c) is a graph showing the frequency characteristics of the low frequency band side of the transmission band of the surface acoustic wave device 100B, the first parallel resonator 111, the second parallel resonator 112 and the third parallel resonator 113. Specifically, in (c) of FIG. 7, the horizontal axis represents a range of 685 to 735 MHz, and the vertical axis represents a range of −50 to 0 dB.

In (c) of FIG. 7, the first frequency characteristic 500B is the frequency characteristic of the surface acoustic wave device 100B. The first parallel resonator frequency characteristic 510B is the frequency characteristic of the first parallel resonator 111. The second parallel resonator frequency characteristic 520B is the frequency characteristic of the second parallel resonator 112. The third parallel, resonator frequency characteristic 530B is the frequency characteristic of the third parallel resonator 113.

As shown in (c) of FIG. 7, the first parallel resonator 111 has a resonance point of −27 dB in the frequency band of about 704 MHz.

The second parallel resonator 112 has a resonance point of −28 dB in the frequency band of, about 708 MHz.

The third parallel resonator 113 has a resonance point of −22 dB in the frequency band of about 706 MHz and a resonance point of −20 dB in, the frequency band of about 712 MHz. In addition, the third parallel resonator 113 has an anti-resonance point of −6 dB in the frequency band of about 708 MHz.

That is, the resonance point of the second parallel resonator 112 corresponds to the anti-resonance point of the third parallel resonator 113. Therefore, the second parallel resonator 112 may suppress the anti-resonance point of the third parallel resonator 113. As a result, as shown in (b) of FIG. 7, the surface acoustic wave device 100B has an attenuation characteristic further rapider (steeper) than that of the surface acoustic wave device 100.

Third Embodiment

Figure 8:
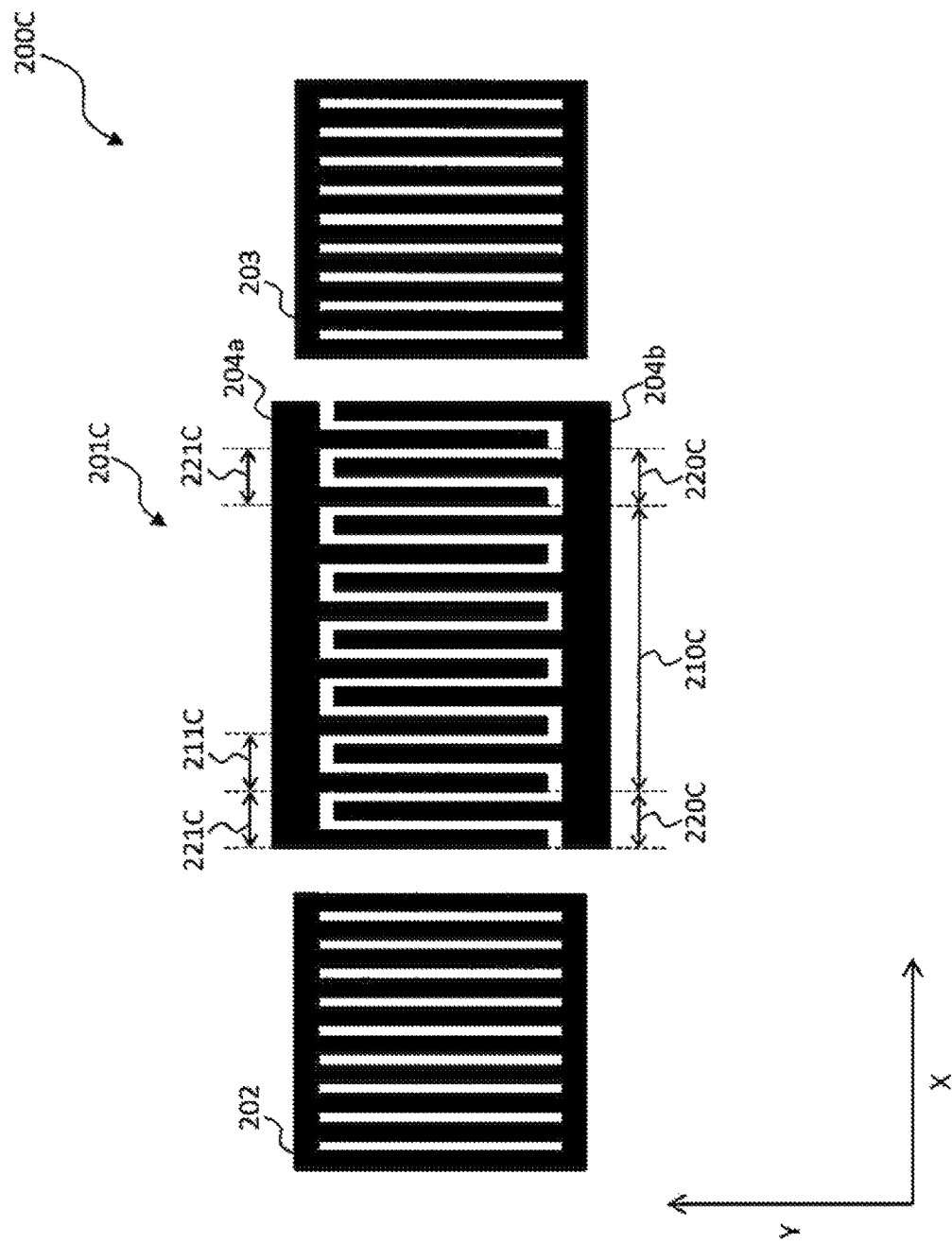
FIG. 8 is a top view showing a SAW resonator related to a third embodiment of the present invention.

FIG. 8 is a top view showing a SAW resonator 200C related to a second embodiment of the present invention.

As shown in FIG. 8, the SAW resonator 200C is provided with a comb-shaped electrode 201C, a first reflector 202 and a second reflector 203.

The SAW resonator 200C has a first section 210C and a second section 220C.

The first section 210C is a section in which electrode fingers are formed at a constant first cycle 211C.

The second section 220C is a section formed in the comb-shaped electrode 201C, in which electrode fingers are formed at a second cycle 221C, which is a constant cycle different from the first cycle 211C. Specifically, in the comb-shaped electrode 201C, the second section 220C is formed at a position adjacent to the first reflector 202 and a position adjacent to the second reflector 203. That is, the second section 220C is separately formed at two positions.

That is, the comb-shaped electrode 201C has two sections having different cycles of electrode fingers.

Figure 9:
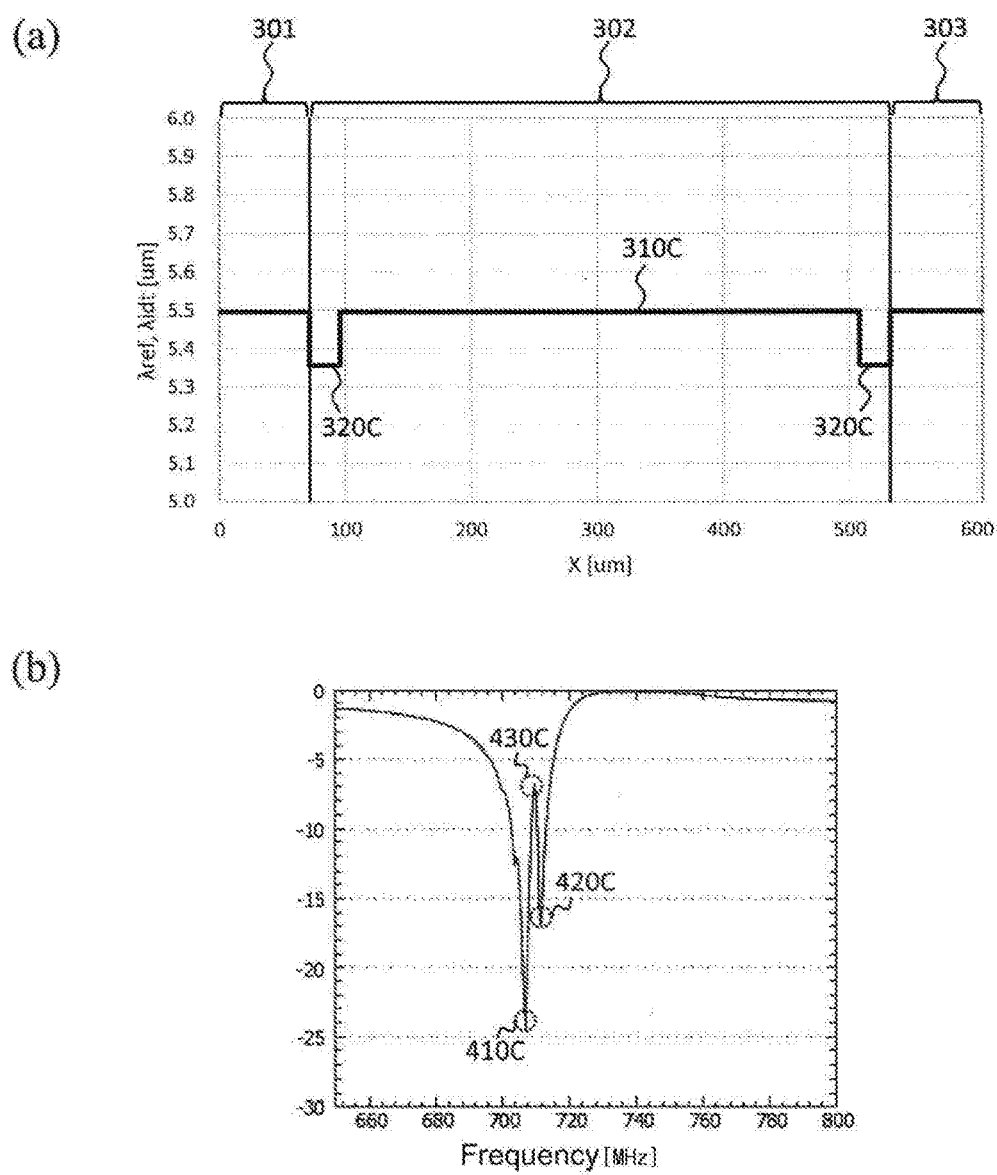
FIG. 9 shows (a) a graph showing the cycles of the electrode fingers and the electrodes of the third embodiment, and (b) a graph showing the frequency characteristic of the SAW resonator of the third embodiment.

In FIG. 9, (a) is a graph showing the cycles of the electrode fingers and the electrodes of the comb-shaped electrode 201C, the first reflector 202 and the second reflector 203 of the SAW resonator 200C, in which the horizontal axis represents a position μm, and the vertical axis represents a cycle μm.

A first range 310C shows the first cycle 211C shown in FIG. 8. A second range 320C shows the second cycle 221C shown in FIG. 8.

As shown in (a) of FIG. 9, the first cycle 211C is 5.497 μm. The second cycle 221C is 5.356 μm. In addition, the cycles shown in (a) of FIG. 9 are examples and do not limit the present invention.

A ratio of the second cycle 221C to the first cycle 211C is about 97.4%. Specifically, the ratio of the second cycle 221C to the first cycle 211C is preferably 95% or higher and lower than 100%.

A ratio of the number of pairs of the electrode fingers of the second section 220C to the number of pairs of the electrode fingers of the entire comb-shaped electrode 201C is about 5.4%. Specifically, the ratio of the number of pairs of the electrode fingers of the second section 220C to the number of pairs of the electrode fingers of the entire comb-shaped electrode 201C is preferably lower than 20%.

In FIG. 9, (b) is a graph showing the frequency characteristic when the SAW resonator 200C is connected as a parallel resonator, in which the horizontal axis represents a frequency MHz, and the vertical axis represents insertion loss dB. Specifically, (b) of FIG. 9 shows the frequency characteristic of the SAW resonator 200C, in which the horizontal axis is in a range of about 650 to 800 MHz, and the vertical axis is in a range of −30 to 0 dB.

The SAW resonator 200C has, a first resonance point 410C in the frequency band of about 706 MHz. That is, the first resonance point 410C corresponds to the first resonance point 410 of the general SAW resonator 200. In addition, the insertion loss of the first resonance point 410C is about −25 dB.

In addition, the SAW resonator 200D has a second resonance point 420C in the frequency band of about 712 MHz. The insertion loss of the second resonance point 420C is about −17 dB. That is, the SAW resonator 200C may also suppress a signal of the frequency band of about 712 MHz.

Accordingly, the SAW resonator 200C also has a resonance point on the side of a frequency band higher than that of the SAW resonator 200. Since the SAW resonator 200C also has a resonance point on the side of a frequency band higher than that of the SAW resonator 200 like this, it may attenuate a signal on the side of a low frequency band of a pass band more rapidly (steeply) than the SAW resonator 200 does.

In addition, the SAW resonator 200C has an anti-resonance point 430C in the frequency band between the first resonance point 410C and the second resonance point 420C. The insertion loss of the anti-resonance point 430C is about −7 dB. That is, the anti-resonance point 430C needs to be suppressed when the SAW resonator 200C is mounted on the surface acoustic wave device.

Figure 10:
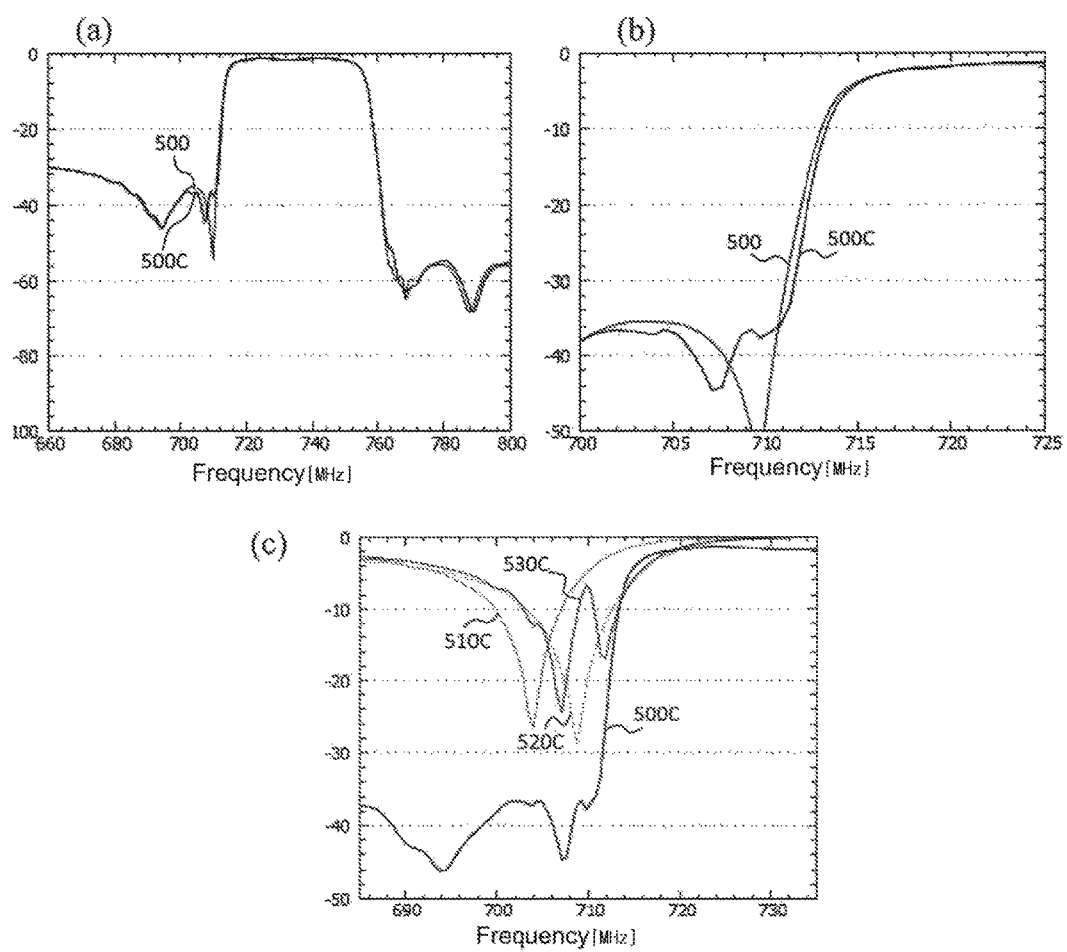
FIG. 10 shows (a) a graph showing the frequency characteristic of the surface acoustic wave device of the third embodiment and the frequency characteristic of a general surface acoustic wave device, (b) a graph partially enlarging (a) of FIG. 10, and (c) a graph showing the frequency characteristic of a parallel resonator provided in the surface acoustic wave device of the third embodiment.

FIG. 10 is a graph for comparing the frequency characteristic of the surface acoustic wave device 100 and the frequency characteristic of the surface acoustic wave device 100C provided with a SAW resonator 200C. In addition, hereinafter, the surface acoustic wave device 100C will be described assuming that only the third parallel resonator 113 is the SAW resonator 200C in the block diagram shown in FIG. 1.

In FIG. 10, (a) is a graph showing the frequency characteristics of the surface acoustic wave device 100 and the surface acoustic wave device 100C, in which the horizontal axis represents a frequency MHz, and the vertical axis represents insertion loss dB. Specifically, (a) of FIG. 10 shows the frequency characteristics of the surface acoustic wave device 100 and the surface acoustic wave device 100C, in which the horizontal axis is in a range of about 660 to 800 MHz, and the vertical axis is in a range of −100 to 0 dB.

In (a) of FIG. 10, the first frequency characteristic 500C shows the frequency characteristic of the surface acoustic wave device 100C. In (a) of FIG. 10, the surface acoustic wave device 100 and the surface acoustic wave device 100C has a further rapider (steeper) attenuation characteristic on the low frequency side of a pass band.

In FIG. 10, (b) is a graph showing enlarged attenuation bands of the low frequency band side of the first frequency characteristic 500 and the first frequency characteristic 500C. Specifically, in (b) of FIG. 10, the range of the horizontal axis is 700 to 725 MHz, and the range of the vertical axis is −50 to 0 dB.

As shown in (b) of FIG. 10, in the attenuation band of about −35 to −6 dB, the surface acoustic wave device 100C attenuates a signal more rapidly (steeply) than the surface acoustic wave device 100 does. As a result, the first frequency characteristic 500C shows a characteristic of being shifted toward the high frequency band side compared with the first frequency characteristic 500. Accordingly, in the attenuation band of about −35 to −6 dB, the surface acoustic wave device 100C has a process margin as wide as a difference between the first frequency characteristic 500C and the first frequency characteristic 500. That is, the surface acoustic wave device 100C improves the process margin and the manufacturing throughput compared with the surface acoustic wave device 100.

In FIG. 10, (c) is a graph showing the frequency characteristics of the low frequency band side of the transmission band of the surface acoustic wave device 100C, the first parallel resonator 111, the second parallel resonator 112 and the third parallel resonator 113. Specifically, in (c) of FIG. 10, the horizontal axis represents a range of 685 to 735 MHz, and the vertical axis represents a range of −50 to 0 dB.

In (c) of FIG. 10, the first frequency characteristic 500C is the frequency characteristic of the surface acoustic wave device 100C. The first parallel resonator frequency characteristic 510C is the frequency characteristic of the first parallel resonator 111. The second parallel resonator frequency characteristic 520C is the frequency characteristic of the second parallel resonator 112. The third parallel resonator frequency characteristic 530C is the frequency characteristic of the third parallel resonator 113.

As shown in (c) of FIG. 10, the first parallel resonator 111 has a resonance point of −27 dB in the frequency band of about 704 MHz.

The second parallel resonator 112 has a resonance point of −28 dB in the frequency band of about 708 MHz.

The third parallel resonator 113 has a resonance point of −25 dB in the frequency band of about 706 MHz and a resonance point of −17 dB in the frequency band of about 712 MHz. In addition, the third parallel resonator 113 has an anti-resonance point of −7 dB in the frequency band of about 708 MHz.

That is, the resonance point of the second parallel resonator 112 corresponds to the anti-resonance point of the third parallel resonator 113. Therefore, the second parallel resonator 112 may suppress the anti-resonance point of the third parallel resonator 113. As a result, as shown in (b) of FIG. 10, the surface acoustic wave device 100C has an attenuation characteristic further rapider (steeper) than that of the surface acoustic wave device 100.

Fourth Embodiment

Figure 11:
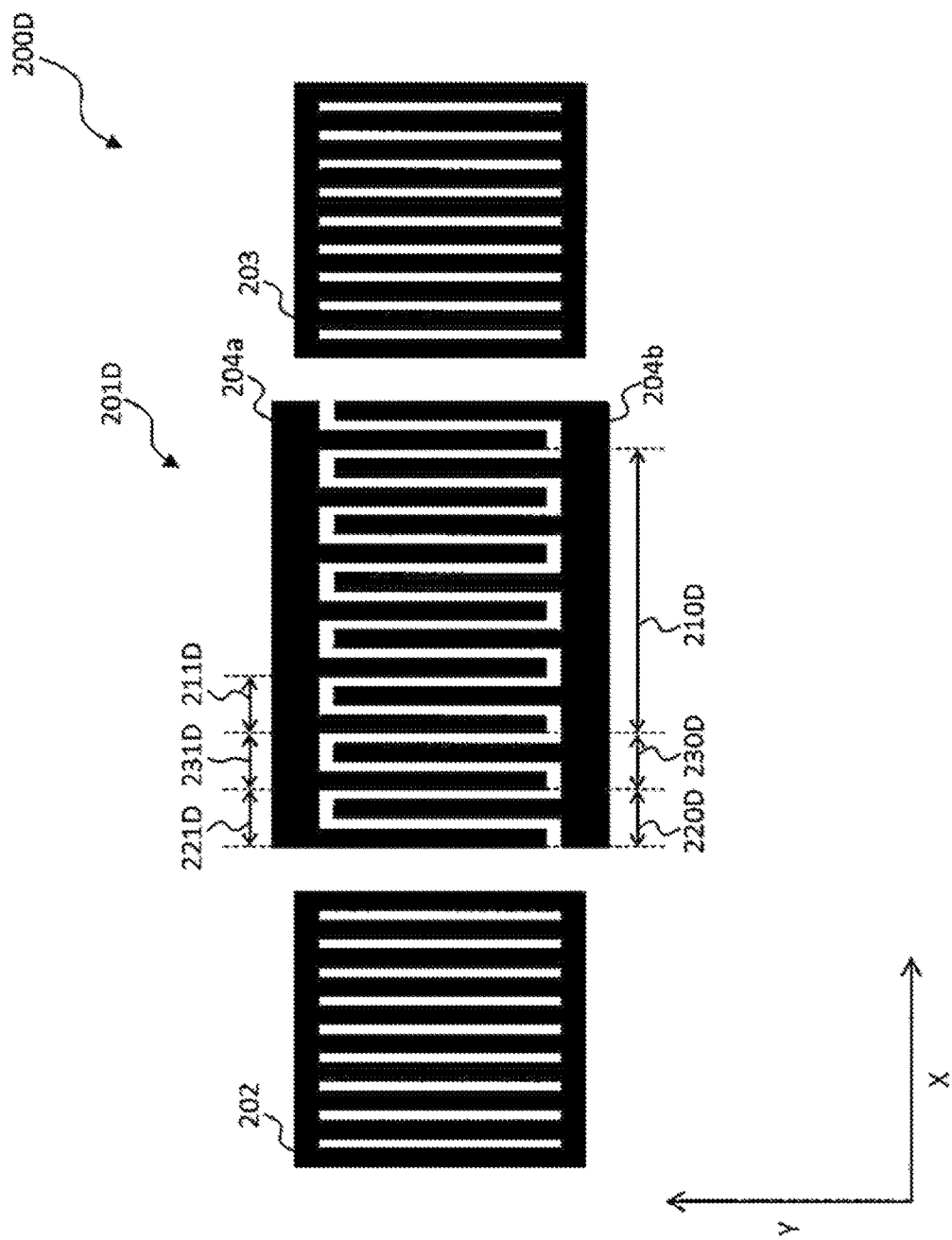
FIG. 11 is a top view showing a SAW resonator related to a fourth embodiment of the present invention.

FIG. 11 is a top view showing a SAW resonator 200D related to a second embodiment of the present invention.

As shown in FIG. 11, the SAW resonator 200D is provided with a comb-shaped electrode 201D, a first reflector 202 and a second reflector 203.

The SAW resonator 200D has a first section 210D, a second section 220D and a third section 230D.

The first section 210D is a section in which electrode fingers are formed at a constant first cycle 211D.

The second section 220D is a section formed in the comb-shaped electrode 201D, in which electrode fingers are formed at a second cycle 221D, which is a predetermined cycle different from the first cycle 211D. Specifically, in the comb shaped electrode 201D, the second section 220D is formed at a position adjacent to the first reflector 202.

The second section 230D is a section formed in the comb-shaped electrode 201D, in which electrode fingers, are formed at a third cycle 231D, which is a constant cycle different from the first, cycle 211D and the second cycle 221D. Specifically, in the comb-shaped electrode 201D, the third cycle 231D is formed between the first section 210D and the second section 220D.

That is, the comb-shaped electrode 201D has three sections having different cycles of electrode fingers.

In FIG. 12, (a) is a graph showing the cycles of the electrode fingers and the electrodes of the comb-shaped electrode 201D, the first reflector 202 and the second reflector 203 of the SAW resonator 200D, in which the horizontal axis represents a position tan, and the vertical axis represents a cycle μm.

A first range 310D shows the first cycle 211D shown in FIG. 11. A second range 320D shows the second cycle 221D shown in FIG. 11. A third range 330D shows the third cycle 231D shown in FIG. 11.

As shown in (a) of FIG. 12, the first cycle 211D is 5.497 μm. The second cycle 221D is 5.427 μm. The third cycle 231D is 5.438 μm. In addition, the cycles shown in (a) of FIG. 12 are examples and do not limit the present invention.

A ratio of the second cycle 221D to the first cycle 211D is about 98.7%. Specifically, the ratio of the second cycle 221D to the first cycle 211D is preferably 95% or higher and lower than 100%.

A ratio of the number of pairs of the electrode fingers of the second section 320D to the number of pairs of the electrode fingers of the entire comb-shaped electrode 201D is about 6.0%. Specifically, the ratio of the number of pairs of the electrode fingers of the second section 320D to the number of pairs of the electrode fingers of the entire comb-shaped electrode 201D is preferably lower than 20%.

A ratio of the third cycle 231D to the first cycle 211D is about 98.9%. Specifically, the ratio of the third cycle 231D to the first cycle 211D is preferably 95% or higher and lower than 100%.

A ratio of the number of pairs of the electrode fingers of the third section 330D to the number of pairs of the electrode fingers of the entire comb-shaped electrode 201D is about 7.5%. Specifically, the ratio of the number of pairs of the electrode fingers of the second section 330D to the number of pairs of the electrode fingers of the entire comb-shaped electrode 201D is preferably lower than 20%.

In FIG. 12, (b) is a graph showing the frequency characteristic when the SAW resonator 200D is connected as a parallel resonator, in which the horizontal axis represents a frequency MHz, and the vertical axis represents insertion loss dB. Specifically, (b) of FIG. 12 shows the frequency characteristic of the SAW resonator 200D, in which the horizontal axis is in a range of about 650 to 800 MHz, and the vertical axis is in a range of −30 to 0 dB.

The SAW resonator 200D has a first resonance point 410D in the frequency band of about 707 MHz. That is, the first resonance point 410D corresponds to the first resonance point 410 of the general SAW resonator 200. In addition, the insertion loss of the first resonance point 410D is about −22 dB.

In addition, the SAW resonator 200D has a second resonance point 420D in the frequency band of about 712 MHz. The insertion loss of the second resonance point 420D is about −10 dB. That is, the SAW resonator 200D may also suppress a signal of the frequency band of about 712 MHz.

Accordingly, the SAW resonator 200D also has a resonance point on the side of a frequency band higher than that of the SAW resonator 200. Since the SAW resonator 200D also has a resonance point on the side of a frequency band higher than that of the SAW resonator 200 like this, it may attenuate a signal on the side of a low frequency band of a pass band more rapidly (steeply) than the SAW resonator 200 does.

In addition, the SAW resonator 200D has an anti-resonance point 430D in the frequency band between the first resonance point 410D and the second resonance point 420D. The insertion loss of the anti-resonance point 430D is about −8 dB. That is, the anti-resonance point 430D needs to be suppressed when the SAW resonator 200D is mounted on the surface, acoustic wave device.

Figure 13:
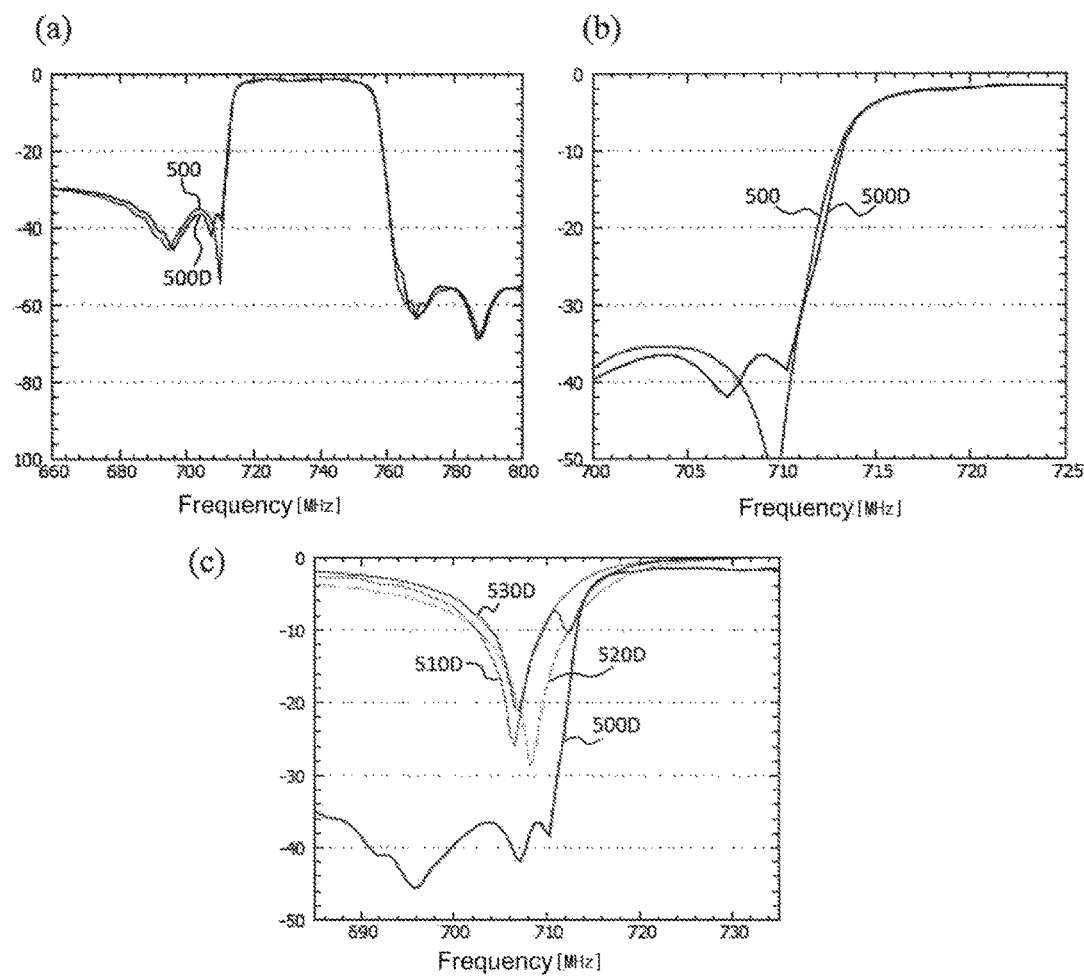
FIG. 13 shows (a) a graph showing the frequency characteristic of the surface acoustic wave device of the fourth embodiment and the frequency characteristic of a general surface acoustic wave device, (b) a graph partially enlarging (a) of FIG. 13, and (c) a graph showing the frequency characteristic of a parallel resonator provided in the surface acoustic wave device of the fourth embodiment.

FIG. 13 is a graph for comparing the frequency characteristic of the surface acoustic wave device 100 and the frequency characteristic of the surface acoustic wave device 100D provided with a SAW resonator 200D. In addition, hereinafter, the surface acoustic wave device 100D will be described assuming that only the third parallel resonator 113 is the SAW resonator 200D in the block diagram shown in FIG. 1.

In FIG. 13, (a) is a graph showing the frequency characteristics of the surface acoustic wave device 100 and the surface acoustic wave device 100D, in which the horizontal axis represents a frequency MHz, and the vertical axis represents insertion loss dB. Specifically, (a) of FIG. 13 shows the frequency characteristics of the surface acoustic wave device 100 and the surface acoustic wave device 100D, in which the horizontal axis is in a range of about 660 to 800 MHz, and the vertical axis is in a range of −100 to 0 dB.

In (a) of FIG. 13, the first frequency characteristic 500D shows the frequency characteristic of the surface acoustic wave device 100D. In (a) of FIG. 13, the surface acoustic wave device 100 and the surface acoustic wave device 100D has a further rapider (steeper) attenuation characteristic on the low frequency side of a pass band.

In FIG. 13, (b) is a graph showing enlarged attenuation bands of the low frequency band side of the first frequency characteristic 500 and the first frequency characteristic 500D. Specifically, in (b) of FIG. 13, the range of the horizontal axis is 700 to 725 MHz, and the range of the vertical axis is −50 to 0 dB.

As shown in (b) of FIG. 13, in the attenuation band of about −28 to −8 dB, the surface acoustic wave device 100D attenuates a signal more rapidly (steeply) than the surface acoustic wave device 100 does. As a result, the first frequency characteristic 500D shows a characteristic of being shifted toward the high frequency band side compared with the first frequency characteristic 500. Accordingly, in the attenuation band of about −28 to −8 dB, the surface acoustic wave device 100D has a process margin as wide as a difference between the first frequency characteristic 500B and the first frequency characteristic 500. That is, the surface acoustic wave device 100D improves the process margin and the manufacturing throughput compared with the surface acoustic wave device 100.

In FIG. 13, (c) is a graph showing the frequency characteristics of the low frequency band side of the transmission band of the surface acoustic wave device 100D, the first parallel resonator 111, the second parallel resonator 112 and the third parallel resonator 113. Specifically, in (c) of FIG. 13, the horizontal axis represents a range of 685 to 735 MHz, and the vertical axis represents a range of −50 to 0 dB.

In (c) of FIG. 13, the first frequency characteristic 500D is the frequency characteristic of the surface acoustic wave device 100D. The first parallel resonator frequency characteristic 510D is the frequency characteristic of the first parallel resonator 111. The second parallel resonator frequency characteristic 520D is the frequency characteristic of the second parallel resonator 112. The third parallel resonator frequency characteristic 530D is the frequency characteristic of the third parallel resonator 113.

As shown in (c) of FIG. 13, the first parallel resonator 111 has a resonance point of −27 dB in the frequency band of about 706 MHz.

The second parallel resonator 112 has a resonance point of −28 dB in the frequency band of about 708 MHz.

The third parallel resonator 113 has a resonance point of −22 dB in the frequency band of about 707 MHz and a resonance point of −10 dB in the frequency band of about 712 MHz. In addition, the third parallel resonator 113 has an anti-resonance point of −7 dB in the frequency band of about 709 MHz.

That is, the resonance point of the second parallel resonator 112 corresponds to the anti-resonance point of the third parallel resonator 113. Therefore, the second parallel resonator 112 may suppress the anti-resonance point of the third parallel resonator 113. As a result, as shown in (b) of FIG. 13, the surface acoustic wave device 100D has an attenuation characteristic further rapider (steeper) than that of the surface acoustic wave device 100.

According to the present invention, a rapid (steep) attenuation characteristic and a high manufacturing throughput can be combined.

While the present invention has been described with reference to a plurality of embodiments, it is not to be restricted by the embodiments. The configuration or details of the present invention can be modified in a variety of forms that can be understood by those skilled in the art within the scope and spirit of the present invention disclosed in the claims.

What is claimed is:

1. A surface acoustic wave device of a ladder type, the device including a series resonator and a parallel resonator, wherein:
   the parallel resonator includes a first reflector, a second reflector, and a comb shaped electrode located between the first reflector and the second reflector, wherein the comb-shaped electrode includes a first section in which electrode fingers are formed at a constant cycle, and a second section in which electrode fingers are formed at a constant cycle different from the cycle of the first section, and
   the parallel resonator has a first resonance point in a low frequency band side of a pass band and a second resonance point in a frequency band different from that of the first resonance point.

2. The surface acoustic wave device according to claim 1, wherein the number of pairs of the electrode fingers in the second section is 5% or higher and lower than 20% of the number of pairs of the electrode fingers in the entire comb-shaped electrode.

3. The surface acoustic wave device according to claim 1, wherein a cycle of the electrode fingers in the second section is 95% or higher and lower than 100% of the cycle of the electrode fingers in the first section.

4. The surface acoustic wave device according to claim 1, wherein the second section is formed to be adjacent to at least one of the first reflector and the second reflector.

5. The surface acoustic wave device according to claim 1, wherein the second section is formed near a center of the comb-shaped electrode.

6. The surface acoustic wave device according to claim 1, wherein the comb-shaped electrode further includes a third section in which electrode fingers are formed at a constant cycle different from the cycles of the first section and the second section.

7. The surface acoustic wave device according to claim 1, wherein the parallel resonator including the comb-shaped electrode formed with the second section has an anti-resonance point in a frequency band between the first resonance point and the second resonance point, and the device is further provided with another parallel resonator having a resonance point suppressing the anti-resonance point.

8. A duplexer provided with the surface acoustic wave device disclosed in claim 1.

9. A comb-shaped electrode used in a surface acoustic wave device of a ladder type, the comb-shaped electrode comprising:
   a first section in which electrode fingers are formed at a constant cycle, and
   a second section in which electrode fingers are formed at a constant cycle different from the cycle of the first section,
   wherein the surface acoustic wave device includes a parallel resonator which has a first resonance point in a low frequency band side of a pass band and a second resonance point in a frequency band different from that of the first resonance point.

10. The comb-shaped electrode according, to claim 9, wherein the number of pairs of the electrode fingers in the second section is 5% or higher and lower than 20% of the number of pairs of the electrode fingers in the entire comb-shaped electrode.

11. The comb-shaped electrode according to claim 9, wherein a cycle of the electrode fingers in the second section is 95% or higher and lower than 100% of the cycle of the electrode fingers in the first section.

12. The comb-shaped electrode according to claim 9, wherein the second section is formed at least at an end of the comb-shaped electrode.

13. The comb-shaped electrode according to claim 9, wherein the second section is formed near a center of the comb-shaped electrode.

14. The comb-shaped electrode according to claim 9, further comprising a third section in which electrode fingers are formed at a constant cycle different from the cycles of the first section and the second section.

* * * * *